(12) United States Patent
Ito et al.

(10) Patent No.: US 7,362,416 B2
(45) Date of Patent: Apr. 22, 2008

(54) EXPOSURE APPARATUS, EVALUATION METHOD AND DEVICE FABRICATION METHOD

(75) Inventors: Jun Ito, Utsunomiya (JP); Takeshi Yamamoto, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 280 days.

(21) Appl. No.: 11/267,755

(22) Filed: Nov. 3, 2005

(65) Prior Publication Data

US 2006/0119828 A1   Jun. 8, 2006

(30) Foreign Application Priority Data

Nov. 4, 2004   (JP)   ............... 2004-320080

(51) Int. Cl.
*G03B 27/54* (2006.01)
*G03B 27/72* (2006.01)
*G21G 5/00* (2006.01)

(52) U.S. Cl. .................. 355/67; 355/69; 250/492.2

(58) Field of Classification Search .............. 355/69, 355/67, 53; 250/372, 492.1, 305, 492.2
See application file for complete search history.

(56) References Cited

U.S. PATENT DOCUMENTS

2003/0142410 A1   7/2003   Miyake

2003/0146391 A1 *   8/2003   Kleinschmidt et al. ..... 250/372
2005/0087699 A1 *   4/2005   Miyake ..................... 250/492.1
2006/0033892 A1 *   2/2006   Cadee et al. ................. 355/30
2006/0050259 A1 *   3/2006   Shinoda ...................... 355/67

FOREIGN PATENT DOCUMENTS

JP   2003-224053   8/2003

* cited by examiner

*Primary Examiner*—Peter B Kim
(74) *Attorney, Agent, or Firm*—Morgan & Finnegan, LLP

(57) ABSTRACT

An exposure apparatus for exposing a pattern of a mask onto an object, said exposure apparatus includes a light source part that includes a generating mechanism for generating a plasma, a condenser mirror for condensing a light radiated from the plasma, and a vacuum chamber for accommodating the generating mechanism and the condenser mirror, and has an opening that is provided at a position approximately corresponding to a position of a condensing point of the light condensed by the condenser mirror, an illumination optical system for illuminating the mask using the light from the light source part, a detector for detecting the light from the condensing point at an emission side of the condensing point, and an evaluation part for evaluating a life of the light source part based on a detected result by the detector.

12 Claims, 10 Drawing Sheets

EXPOSURE APPARATUS, EVALUATION METHOD AND DEVICE FABRICATION METHOD

BACKGROUND OF THE INVENTION

The present invention relates generally to an exposure apparatus, and more particularly to a life evaluation of a light source used in an exposure apparatus for exposing an object, such as a single crystal substrate of a semiconductor wafer etc. and a glass plate for a liquid crystal display ("LCD"). The present invention is suitable, for example, for an exposure apparatus that uses an extreme ultraviolet ("EUV") light as a light source for exposure.

Conventionally, the photolithography technology has employed a reduction projection exposure apparatus using a projection optical system to project a circuit pattern of a mask (reticle) onto a wafer, etc., in manufacturing fine semiconductor devices such as a semiconductor memory and a logic circuit.

The minimum critical dimension to be transferred by the projection exposure apparatus or resolution is proportionate to a wavelength of light used for exposure, and inversely proportionate to the numerical aperture ("NA") of the projection optical system. The shorter the wavelength is, the better the resolution. Thus, along with recent demands for finer semiconductor devices, uses of shorter ultraviolet light wavelengths have been promoted—from an ultra-high pressure mercury lamp (I-line with a wavelength of approximately 365 nm) to KrF excimer laser (with a wavelength of approximately 248 nm) and ArF excimer laser (with a wavelength of approximately 193 nm).

However, the lithography using the ultraviolet light has limitations when it comes to satisfying the rapidly promoted fine processing of a semiconductor device. Therefore, a reduction projection optical system using the EUV light with a wavelength of 10 to 15 nm shorter than that of the ultraviolet light (referred to as an "EUV exposure apparatus" hereinafter) has been developed to efficiently transfer very fine circuit patterns of 0.1 μm or less. The EUV exposure apparatus typically uses a light source (LPP light source) using a laser produced plasma ("LPP") manner and a light source (DPP light source) using a discharge produced plasma ("DPP") manner.

The LPP light source irradiates a highly intensified pulse laser beam to a target material (such as a metallic thin film, inert gas, and droplets) supplied to a vacuum chamber by a gas jet etc., thus generating high-temperature plasma for use as EUV light with a wavelength of about 13.4 nm emitted from the plasma. On the other hands, the DPP light source applies high-voltage between electrodes, emits gas such as xenon for discharge, induces the high-temperature plasma, and generates the EUV light. A condenser mirror that condenses the EUV light from the plasma is provided in these EUV light sources to efficiently use the EUV light.

However, the LLP light source generates not only the EUV light from the target material but also flying particles called debris. A supply mechanism that supplies the target material also emits the debris. Moreover, the electrode emits the debris in the DPP light source. The debris causes contaminations, damages, and lowered reflectivity of optical elements, making uneven the light intensity and deteriorating the throughput. Accordingly, emitting inert gas such as helium (He) as a buffer gas, and a debris mitigation system is provided to remove the debris.

On the other hands, while the EUV light source repeats emissions of the EUV light, the light intensity of the EUV light irradiated from the EUV light source deteriorates by damages and deterioration of the electrode, lowered reflectivity of mirrors caused by flying particles such as debris that is not removed. In this case, it is necessary to exchange the EUV light and each member in the EUV light source. Then, a life evaluation of the EUV light source or a life evaluation of each member in the EUV light source has been proposed. See, for example, Japanese Patent Application, Publication No. 2003-224053. The EUV exposure apparatus disclosed in Japanese Patent Application, Publication No. 2003-224053 measures the light intensity of the EUV light, and controls an exposure dose or evaluates mirror damages based on the measured result. The light intensity of the EUV light is measured by detecting a part of an illumination light diverged in a position of a reflective integrator using a detector.

However, Japanese Patent Application, Publication No. 2003-224053 directly (without through a condensing point) detects the EUV light irradiated from the EUV light source, and does not provide the detector in a clean environment (high vacuum atmosphere). Therefore, the detector used deteriorates, and does not provide correct information. In other words, because the detector is provided in a space that generates the plasma, the detector is subject to the flying particles such as debris, and cannot detect the light intensity of the EUV light.

In the LPP light source, the detector that is provided in the same space as the plasma (target supply mechanism) and the electrode is subject to noise and electromagnetic wave by high-frequency noises from the target supply mechanism that supplies the target with a high-speed frequency using a piezoelectric element etc. In the DPP light source, the detector that is provided in the same space as the plasma (target supply mechanism) and the electrode is subject to noises and electromagnetic waves by high-frequency noises generated by the high voltage applied between electrodes. Therefore, the detected result by the detector includes an error, or cannot provide correct information of the EUV light, and the life of the EUV light source cannot be evaluated correctly.

The erroneous life evaluation of the EUV light source would cause exposure to continue with the EUV light source that must be exchanged or the EUV light source that does not need to be exchanged to be improperly exchanged, thereby deteriorating the exposure performance such as an imaging performance, cost, and throughput.

BRIEF SUMMARY OF THE INVENTION

Accordingly, the present invention is directed to an exposure apparatus, an evaluation method, and a device fabrication method, which can correctly evaluate the life of the light source, and achieve the excellent exposure performance.

An exposure apparatus according to one aspect of the present invention for exposing a pattern of a mask onto an object, said exposure apparatus includes a light source part that includes a generating mechanism for generating a plasma, a condenser mirror for condensing a light radiated from the plasma, and a vacuum chamber for accommodating the generating mechanism and the condenser mirror, and has an opening that is provided at a position approximately corresponding to a position of a condensing point of the light condensed by the condenser mirror, an illumination optical system for illuminating the mask using the light from the light source part, a detector for detecting the light from the condensing point at an emission side of the condensing point, and an evaluation part for evaluating a life of the light source part based on a detected result by the detector.

An evaluation method according to another aspect of the present invention for evaluating a life of an light source part used in an exposure apparatus for exposing a pattern of a mask onto an object, the exposure appratus including a light source that includes a generating mechanism that generates a plasma, a condenser mirror that condenses a light radiated from the plasma, and a vacuum chamber that accommodates the generating mechanism and the condenser mirror, and has an opening that is provided at a position approximately corresponding to a position of a condensing point of the light condensed by the condenser mirror, and an illumination optical system for illuminating the pattern of the mask using the light from the light source part, said evaluation method includes the steps of storing an condition of the light from the condensing point in an initial state, detecting the light from the condensing point at an emission side of the condensing point, comparing the detected result detected by the detecting step and the condition of the light stored by the storing step, and evaluating an exhausted life of the light source part when a difference between the detected result detected by the detecting step and the condition of the light stored by the storing step exceeds a threshold set beforehand in the comparing step.

A device fabrication method according to another aspect of the present invention includes the steps of exposing an object using the above exposure apparatus, and performing a development process for the object exposed.

Other objects and further features of the present invention will become readily apparent from the following description of the preferred embodiments with reference to the accompanying drawings.

DETAILED DESCRIPTION OF THE PREFERRED EMBODIMENTS

Figure 1:
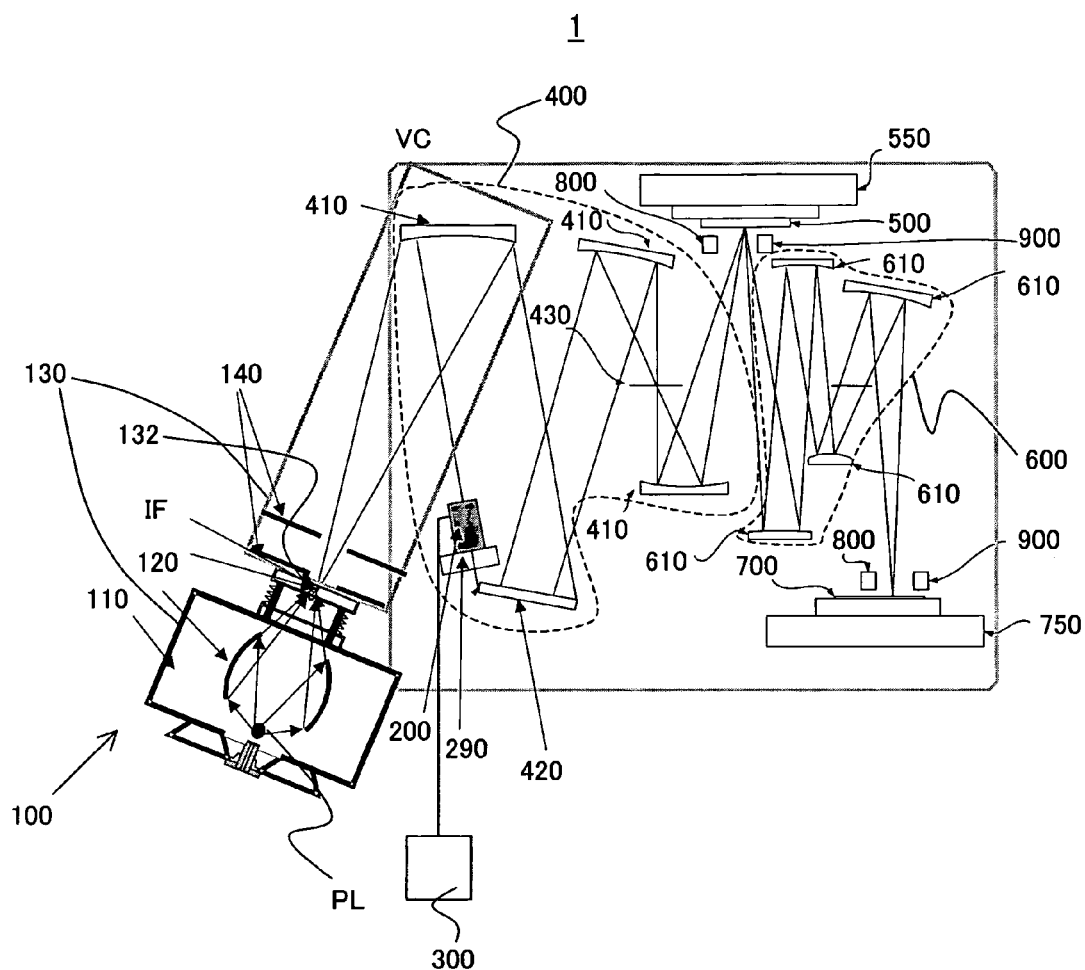
FIG. 1 is a schematic sectional view of an exposure apparatus as one aspect according to the present invention.

With reference to the accompanying drawings, a description will be given of an exposure apparatus as one aspect according to the present invention. In each figure, the same reference numeral denotes the same element. Therefore, duplicate descriptions will be omitted. Here, FIG. 1 is a schematic sectional view of the exposure apparatus 1 according to the present invention. In the exposure apparatus 1, an EUV light source part 100 side is an upstream side, and a mask 500 side is a downstream.

The exposure apparatus 1 of the present invention uses the EUV light (with a wavelength of, e.g., 13.4 nm) as illumination light for exposure, and exposes onto an object 700 a circuit pattern of a mask 500, for example, in a step-and-scan manner. Of course, the present invention is applicable to a step-and-repeat exposure apparatus ("stepper"). This exposure apparatus is suitable for a lithography process less than submicron or quarter micron, and the present embodiment uses the step-and-scan exposure apparatus (also referred to as a "scanner") as an example. The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat" manner is another mode of exposure method that moves a wafer stepwise to an exposure area for the next shot every shot of cell projection onto the wafer.

Referring to FIG. 1, the exposure apparatus 1 includes an EUV light source 100, a detector 200, an evaluation part 300, an illumination optical system 400, a mask stage 550, a projection optical system 600, a wafer stage 750, an alignment detecting mechanism 800, and a focus position detecting mechanism 900.

As shown in FIG. 1, at least the optical path through which the EUV light travels (or the entire optical system) should preferably be maintained in a vacuum atmosphere VC, since the EUV light has low transmittance to the air and causes contaminations as a result of response to components of residual gas (or polymer organic gas).

The EUV light source 100 is, in FIG. 1, a DDP light source that generates the EUV light using a DPP manner, and includes a generating mechanism 110, a condenser mirror 120, a light source chamber 130, and an aperture 140. The EUV light source 100 shown in FIG. 1 can also be replaced by a LPP light source using a LPP manner.

The generating mechanism 110 generates a discharge by xenon (Xe) gas for instance supplied from a nozzle and a high electric voltage applied to an electrode, and generates a plasma PL with high density be a pinch action based on a self-magnetic field of a charged particle flow. The plasma PL radiates the EUV light.

The condenser mirror 120 is a grazing incidence mirror, reflects the EUV light radiated from the plasma PL, and condenses on a condensing point IF.

The light source chamber 130 is a vacuum chamber that maintains a vacuum atmosphere by a vacuum exhausting pump (not shown), and accommodates the generating mechanism 110 and the condenser mirror 120. The light source chamber 130 has an opening 132 that is provided at a position approximately corresponding to a position of the condensing point IF of the EUV light condensed by the condenser mirror 120.

The aperture 140 is provided near the opening 132 of the light source chamber 130, in other words, near the condensing point IF of the EUV light. An illumination chamber that accommodates the light source chamber 130 and the illumination optical system 400 is connected by only the opening 132 and the aperture 140. Thereby, a vacuum between the EUV light source 100 and the illumination optical system 400 can be increased, and an inflow of flying particles to the illumination optical system 400 side from the EUV light source 100 can be controlled. Moreover, the aperture 140 reduces a noise generated from the plasma PL as described later.

The detector 200 detects the EUV light from the condensing point IF in the downstream of the aperture 140. Although the generating mechanism 110 generates the plasma PL by the discharge, generates a large noise (high frequency noise) because the plasma PL has a voltage of plural kV, a current of plural A, and a repetition frequency of approximately 10 kHz. Therefore, if the EUV light is detected inside the light source chamber 130, an influence of the noise is received, and a detecting accuracy deteriorates. Since the detector 200 detects the EUV light at the downstream of the aperture 140, can reduce the influence of the noise, and can detects with high accuracy.

The detector 200 is provided between an illumination system mirror 410 of the illumination optical system 400 and an optical integrator 420 in the instant embodiment, and detects the EUV light that passes through the aperture 140 and is reflected by the illumination system mirror 410. The illumination mirror 410 has a multilayer film that alternately forms or layers molybdenum (Mo) and silicon (Si), reflects a light with a wavelength of 20 nm or less and a light with a wavelength of 200 nm or more, and monochromates the EUV light with a wide band from the plasma PL. In other words, the detector 200 can detect the light with the narrowed wavelength band by arranging the detector 200 at the downstream side of the illumination system mirror 410 in near the wavelength of the exposure light. However, considering the detecting accuracy, since an absorption of the EUV light by the illumination system mirror 410 can not be disregarded, the detector 200 is preferably provided at the downstream side of a first illumination system mirror 410 (of the most EUV light source 100 side) of the illumination optical system 400. A filter such as a zirconium (Zr) and silicon (Si) may be installed to narrow wavelength band expect the EUV light that is not able to be removed by the illumination system mirror 410.

The detector 200 is, for example, a photodiode including Zr filter at an incident side, and detects a light intensity of the EUV light in the instant embodiment. In other words, the detector 200 detects the light intensity of the EUV light between the condensing point IF and the optical integrator 420. The detector 200 may be constituted using a CCD that has a sensitivity for the EUV light.

The detector 200 is fixed to a moving mechanism 290 so that it is located on and removed from on an optical path of the EUV light. The detector 200 moves to a predetermined position on the optical path of the EUV light when detects the EUV light. The detector 200 evacuates to a position that does not interrupt the optical path of the EUV light when does not detect the EUV light.

The evaluation part 300 includes a CPU and a memory (not shown), and evaluates a life of the EUV light source 100 based on the detected result by the detector 200. In detail, the evaluation part 300 compares an EUV light condition (in the instant embodiment, a light intensity) in an initial state of the EUV light source 100 stored in the memory with the detected result by the detector 200, and evaluates an exhausted life of the EUV light source 100 when a threshold set beforehand is exceeded. The EUV light condition in the initial state of the EUV light source 100 is detected by the detector 200 when the EUV light source 100 is exchanged or members in the EUV light source 100 are exchanged.

For example, when the generating part 110 and the condenser mirror 120 etc. arranged in the EUV light source 100 or the light source chamber 130 are exchanged, the light intensity of the EUV light in the initial state is detected using the detector 200. The light intensity of the EUV light detected at this time is set to a [mJ/pulse] at an average more than N pulse (50 pulse), and the threshold is set to 0.9a [mJ/pulse]. Here, a value of the light intensity that decreases 10% from the initial state is set as the threshold. However, the threshold can be set as arbitrary values.

Next, the EUV light source 100 is repeatedly used (for a long time), the light intensity of the EUV light is periodically detected to a timing except exposing the object 700 or an arbitrary timing using the detector 200. The light intensity of the EUV light detected at this time is set to c [mJ/pulse]. The evaluation part 300 compares the a [mJ/pulse] with c [mJ/pulse], and evaluates the exhausted life of the EUV light source 100 if the c is 0.9a or less. Moreover, the life of the EUV light source 100 can be correctly evaluated by combining a variation vale with the average value of the EUV light intensity.

The detector is provided between the condensing point IF of the EUV light and the optical integrator 420, and the light intensity of the EUV light from the condensing point IF is detected using the detector 200. Thereby, the influence of the noise is reduced, and an information of the light intensity of the EUV light can be obtained with high accuracy. Therefore, the life of the EUV light source 100 can be correctly evaluated based on the detected result by the detector 200.

Figure 2:
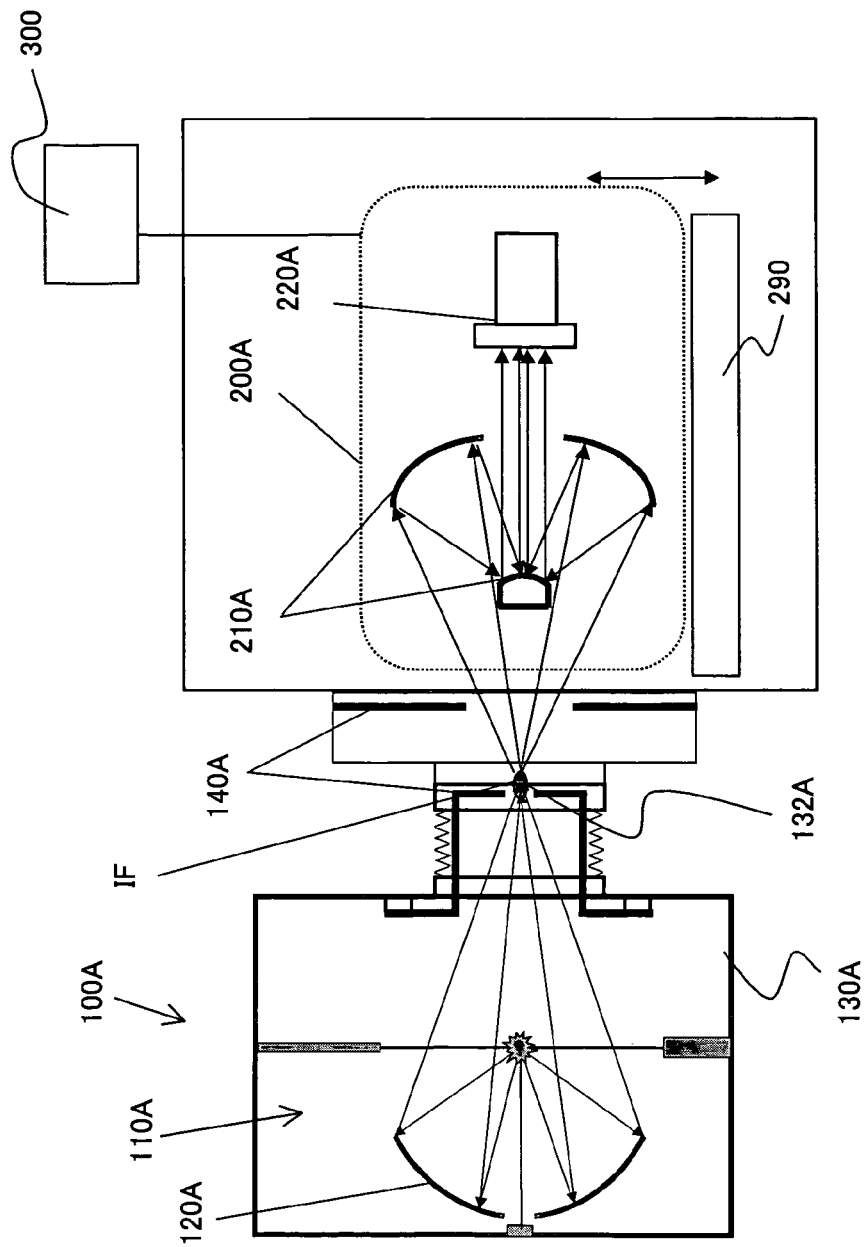
FIG. 2 is a schematic sectional view of an EUV light source and a detector of the exposure apparatus shown in FIG. 1.

The detector 200 is not limited to the photodiode that detects the light intensity of the EUV light. The detector 200 may be an angle distribution detector 200A that detects an angle distribution of the EUV light between the condensing point IF and the optical integrator 420 as shown in FIG. 2. FIG. 2 is a schematic sectional view of an EUV light source 100A and the detector 200 of the exposure apparatus 1. In FIG. 2, a description will be given of the EUV light source 100A that generates the EUV light using the LPP manner, as the LPP light source. In addition, the EUV light source 100A shown in FIG. 2 can be replaced by the DPP light source.

The EUV light source 100A includes, as shown in FIG. 2, a generating mechanism 110A, a condenser mirror 120A, a light source chamber 130A, and an aperture 140A.

The generating mechanism 110A irradiates a laser beam onto a target material supplied from a target supply mechanism, and generates the plasma PL. The plasma PL radiates the EUV light.

The condenser mirror 120A is a multilayer mirror that has a Si/Mo multilayer film, reflects the EUV light radiated from the plasma PL, and condenses at a condensing point IF. Since the condenser mirror 120A has the Si/Mo multilayer film, monochromates the light with a wide band from the plasma PL.

The light source chamber 130A is a vacuum chamber that maintains a vacuum atmosphere by a vacuum exhausting pump (not shown), and accommodates the generating mechanism 110A and the condenser mirror 140A. The light source chamber 130A has an opening 132A that is provided at a position approximately corresponding to a position of the condensing point IF condensed by the condenser mirror 120A.

The aperture 140A is provided near the opening 132A of the light source chamber 130A, in other words, near the condensing point IF of the EUV light. An illumination chamber that accommodates the light source chamber 132A and the illumination optical system 400 is connected by only the opening 132A and the aperture 140A. Thereby, a vacuum between the EUV light source 100A and the illumination optical system 400 can be increased, and an inflow of flying particles to the illumination optical system 400 side from the EUV light source 100A can be controlled. Moreover, the aperture 140A reduce a noise generated from the target supply mechanism as described later.

The angle distribution detector 200A is provided between the aperture 140A and the optical integrator 420, and detects the angle distribution of the EUV light that passes through the aperture 140A. The EUV light from the plasma PL is narrowed a wavelength band by the condenser mirror 120A, and becomes a wavelength band near the exposure light. Therefore, it is not necessary to provide the angle distribution detector 200A at the downstream of the illumination system mirror 410 of the illumination optical system 400. The generating mechanism 110A (target supply mechanism) drives a piezoelectric element by repetition of 100 kHz or more, and supplies the target material. Therefore, the generating mechanism 110A generates a large noise. Then, if the EUV light is detected inside the light source chamber 130A, an influence of the noise is received, and a detecting accuracy deteriorates. Since the angle distribution detector 200A detects the angle distribution of the EUV light at the downstream of the aperture 140A, can reduce the influence of the noise, and can detects with high accuracy. Of course, the influence of the noise can be reduced by narrowing the opening of the light source chamber 130A and the aperture 140A.

The angle distribution detector 200A includes a Schwarzschild mirror 210A that converts the EUV light that passes through the aperture 140A into a parallel light and a back surface irradiation type CCD 220A that detects the EUV light reflected by the Schwarzschild mirror 210. The Schwarzschild mirror 210A includes a concave mirror and a convex mirror that have a Mo/Si multilayer film. The back surface irradiation type CCD 220A has a Zr filter to narrow wavelength band expect the EUV light that is not able to be removed by the condenser mirror 120A and the Schwarzschild mirror 210A. In addition, the back surface irradiation type CCD 220A may be a photodiode that can move (in other words, can change a detecting position).

The angle distribution detector 200A is fixed to the moving mechanism 290 so that it is located on and removed from on the optical path of the EUV light. The angle distribution detector 200A moves to a predetermined position on the optical path when detects the EUV light. The angle distribution detector 200A evacuates to a position that does not interrupt the optical path when does not detects the EUV light.

The evaluation part 300 compares, in the instant embodiment, an angle distribution of the EUV light in the initial state of the EUV light source 100A stored in the memory with the detected result by the angle distribution detector 200A, and evaluates the exhausted life of the EUV light source 100A when a threshold set beforehand is exceeded. The angle distribution of the EUV light in the initial state of the EUV light source 100A is detected by the angle distribution detector 200A when the EUV light source 100A is exchanged or members in the EUV light source 100A are exchanged.

Figure 3A:
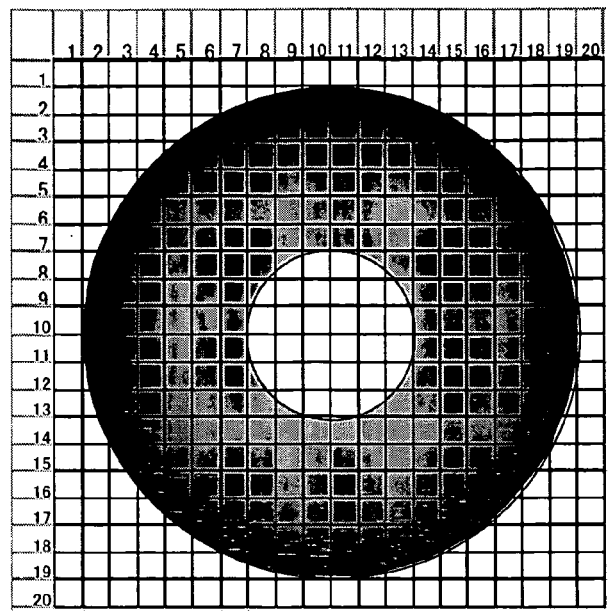
FIGS. 3A and 3B are views of one example of a detected result detected by an angle distribution detector shown in FIG. 2.

For example, when the EUV light source 100A is exchanged, the angle distribution of the EUV light in the initial state is detected using the angle distribution detector 200A. For example, FIG. 3A shows the angle distribution of the EUV light detected by the angle distribution detector 200A when the laser beam of N pulse is irradiated. In FIG. 3A, a white part shows that the light intensity of the EUV light is more intensity. Although the back surface irradiation type CCD 220A is 20 pixels×20 pixels, if the number of pixels is increased by making a one pixel pitch still finer, a more detailed information of the EUV light can be obtained.

Next, the EUV light source 100A is repeatedly used (for a long-term time), the angle distribution of the EUV light is periodically detected to a timing except exposing the object 700 or an arbitrary timing using the angle distribution detector 200A. For example, FIG. 3B shows the angle distribution of the EUV light detected by the angle distribution detector 200A when the laser beam of N pulse is irradiated.

Figure 3B:
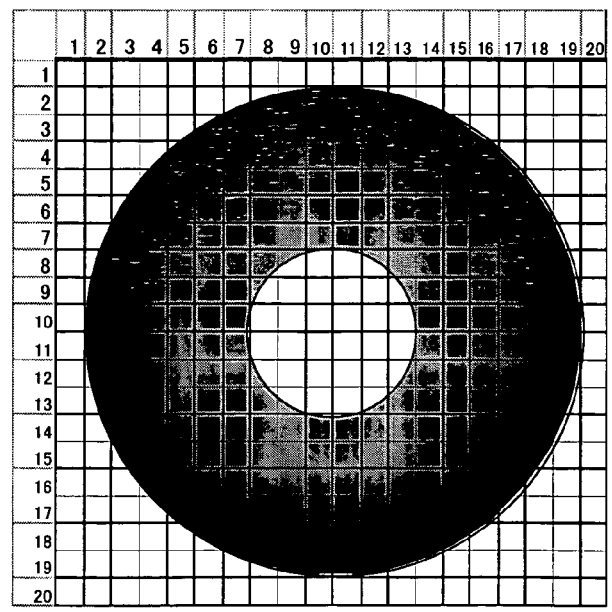

The evaluation part 300 compares the angle distribution of the EUV light shown in FIG. 3A with the angle distribution of the EUV light shown in FIG. 3B, and evaluates the life of the EUV light source 100A. For example, the evaluation part 300 compares the light intensity of the pixel of the same position, and evaluates the exhausted life of the EUV light source 101A if the correlation coefficient is 0.95 or less.

The angle distribution detector 200A is provided between the condensing point IF of the EUV light and the optical integrator 420, and the angle distribution of the EUV light from the condensing point IF is detected using the angle distribution detector 200A. Thereby, the influence of the noise is reduced, and an information of the angle distribution of the EUV light can be obtained with high accuracy. Therefore, the life of the EUV light source 100A can be correctly evaluated based on the detected result by the angle distribution detector 200A.

Figure 4:
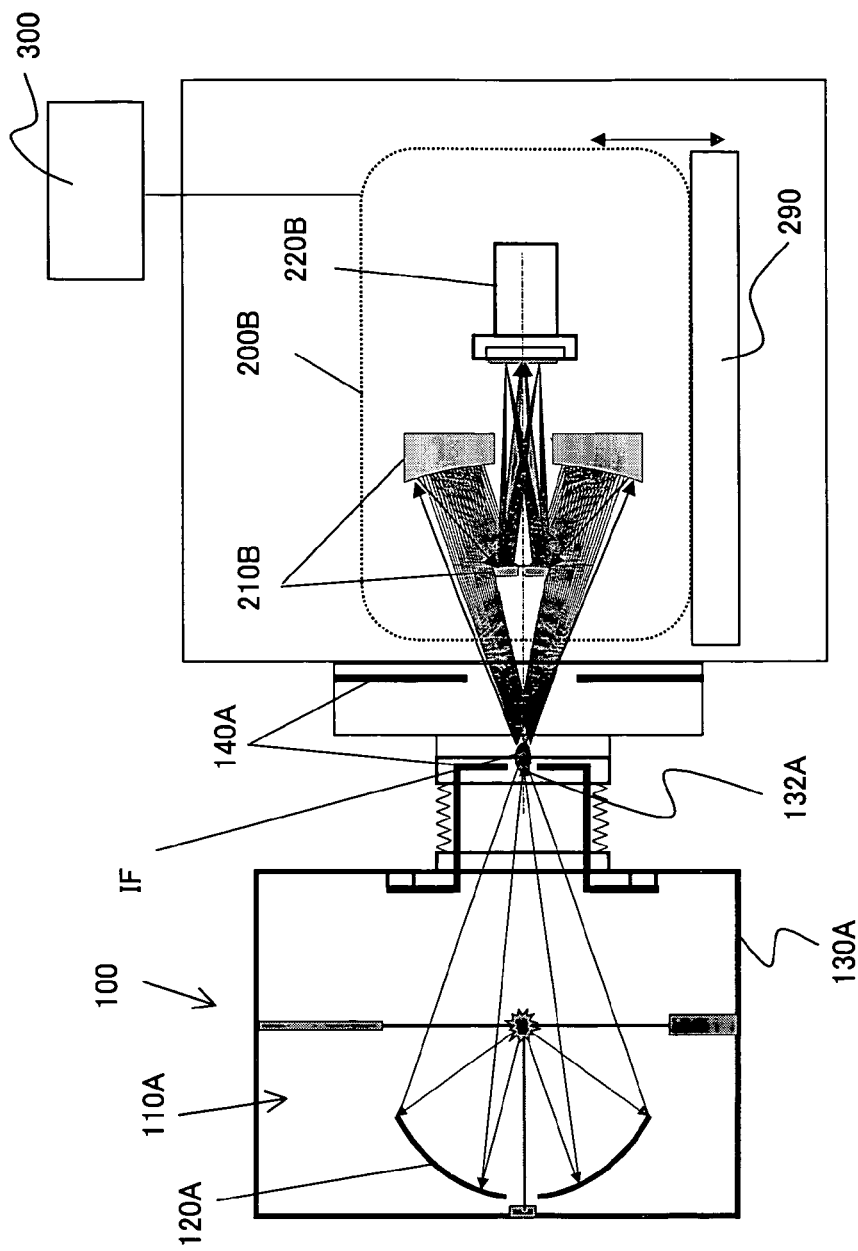
FIG. 4 is a schematic sectional view of an EUV light source and a detector of the exposure apparatus shown in FIG. 1.

Furthermore, the detector 200 may be a spatial distribution detector 200B that detects a spatial distribution of the EUV light between the condensing point IF and the optical integrator 420 as shown in FIG. 4. FIG. 4 is a schematic sectional view of the EUV light source 100A and the detector 200 of the exposure apparatus 1. In addition, the EUV light source 100A shown in FIG. 4 can be replaced by the DPP light source.

The spatial distribution detector 200B is provide between the aperture 140A and the optical integrator 420, and detects the spatial distribution of the EUV light that passes through the aperture 140A. The spatial distribution detector 200B includes an optical element 210B that images the EUV light that passes through the aperture 140A onto a back surface irradiation type CCD 220B and the back surface irradiation type CCD 220B that detects the EUV light reflected by the optical element 210B. The optical element 210B is a multilayer mirror that has a Mo/Si multilayer mirror. The back surface irradiation type CCD 220B has a Zr filter to narrow wavelength band expect the EUV light that is not able to be removed by the condenser mirror 120A and the optical element 210B.

The spatial distribution detector 200B is fixed to the moving mechanism 290 so that it is located on and removed from on the optical path of the EUV light. The spatial distribution detector 200B moves to a predetermined position on the optical path when detects the EUV light. The spatial distribution detector 200B evacuates to a position that does not interrupt the optical path when does not detects the EUV light.

The evaluation part 300 compares, in the instant embodiment, a spatial distribution of the EUV light in the initial state of the EUV light source 100A stored in the memory with the detected result by the spatial distribution detector 200B, and evaluates the exhausted life of the EUV light source 100A when a threshold set beforehand is exceeded.

The spatial distribution of the EUV light in the initial state of the EUV light source 100A is detected by the spatial distribution detector 200B when the EUV light source 100A is exchanged or members in the EUV light source 100A are exchanged.

Figure 5A:
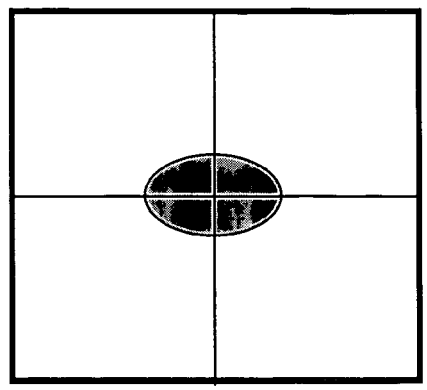
FIGS. 5A, 5B and 5C are views of one example of a detected result detected by an angle distribution detector shown in FIG. 4.

For example, when the EUV light source 100A is exchanged, the spatial distribution of the EUV light in the initial state is detected using the spatial distribution detector 200B. For example, FIG. 5A shows the spatial distribution of the EUV light detected by the spatial distribution detector 200B when the laser beam of N pulse is irradiated. Thereby, a size and gravity position of the condensing point IF can be obtained.

Next, the EUV light source 100A is repeatedly used (for a long time), the spatial distribution of the EUV light is periodically detected to a timing except exposing the object 700 or an arbitrary timing using the spatial distribution detector 200B. For example, FIGS. 5B and 5C show the spatial distributions of the EUV light detected by the spatial distribution detector 200B when the laser beam of N pulse is irradiated.

Figure 5B:
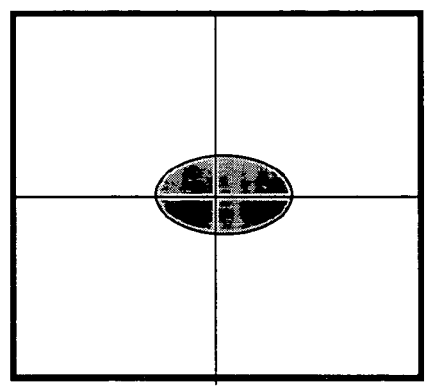
Figure 5C:
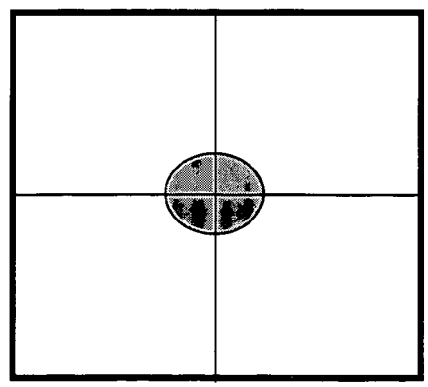

The evaluation part 300 compares the spatial distribution of the EUV light shown in FIG. 5A with the spatial distribution of the EUV light shown in FIG. 5B or 5C, and evaluates the life of the EUV light source 100A. As compared with FIG. 5A, the position of the condensing point IF changes in the FIG. 5B, and the size of the condensing point IF changes in FIG. 5C. The evaluation part 300 evaluates the exhausted life of the EUV light source 100A when the gravity position generates a position sift of 1/10 to the size (diameter) of the condensing point IF or a change rate of the size of the condensing point IF becomes 5% or more.

The spatial distribution detector 200B is provided between the condensing point IF of the EUV light and the optical integrator 420, and the spatial distribution of the EUV light from the condensing point IF is detected using the spatial distribution detector 200B. Thereby, the influence of the noise is reduced, and an information of the spatial distribution of the EUV light can be obtained with high accuracy. Therefore, the life of the EUV light source 100A can be correctly evaluated based on the detected result by the spatial distribution detector 200B.

Figure 6:
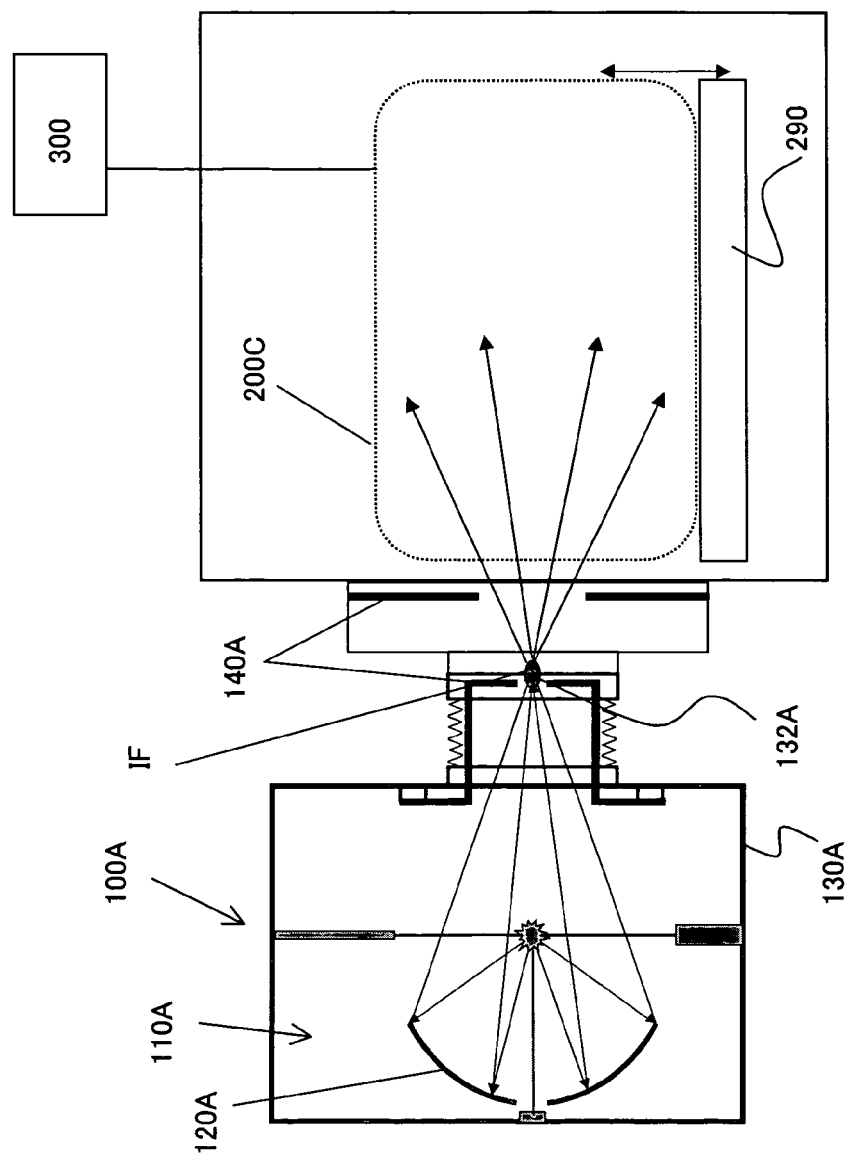
FIG. 6 is a schematic sectional view of an EUV light source and a detector of the exposure apparatus shown in FIG. 1.

Furthermore, the detector 200 may be a spectrum detector 200C that detects a spectrum of the EUV light (with specific wavelength band of 11 nm to 18 nm) between the condensing point IF and the optical integrator 420 as shown in FIG. 6. FIG. 6 is a schematic sectional view of the EUV light source 100A and the detector 200 of the exposure apparatus 1. In addition, the EUV light source 100A shown in FIG. 6 can be replaced by the DPP light source.

Figure 7:
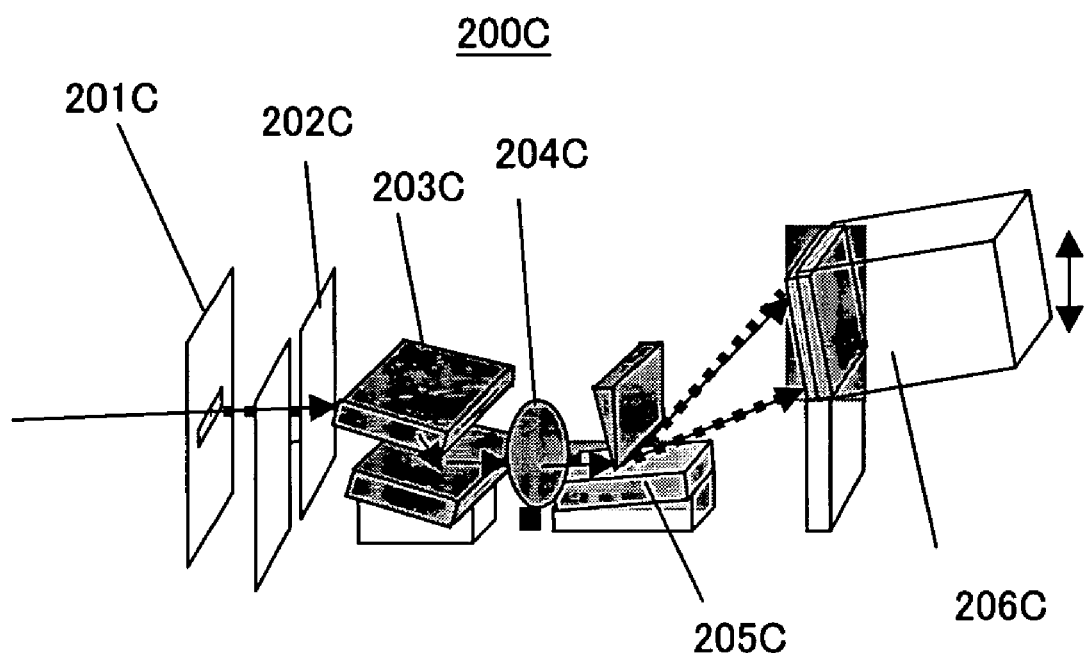
FIG. 7 is a schematic perspective view of a spectrum detector shown in FIG. 6.

The spectrum detector 200C is provided between the aperture 140A and the optical integrator 420, and detects the spectrum of the EUV light that passes through the aperture 140A. FIG. 7 shows the spectrum detector 200C. The spectrum detector 200C includes, as shown in FIG. 7, a pinhole 201C, a slit 202C, a carbon mirror 203C, a filter 204C, a grating 205C, and a back surface irradiation type CCD 206C. The spectrum detector 200C detects the EUV light limited to the light intensity and angle by the pinhole 201C and slit 202C by the back surface irradiation type CCD 206C via the carbon mirror 203C, the filter 204C and the grating 205C. The filter 204C is exchangeable and is used for a wavelength calibration of the spectrum detected.

The spectrum detector 200C is fixed to the moving mechanism 290 so that it is located on and removed from on the optical path of the EUV light. The spectrum detector 200C moves to a predetermined position on the optical path when detects the EUV light. The spectrum detector 200C evacuates to a position that does not interrupt the optical path of the EUV light when does not detects the EUV light.

The evaluation part 300 compares, in the instant embodiment, a spectrum of the EUV light in the initial state of the EUV light source 100A stored in the memory with the detected result by the spectrum detector 200C, and evaluates the exhausted life of the EUV light source 100A when a threshold set beforehand is exceeded. The spectrum of the EUV light in the initial state is detected by the spectrum detector 200C when the EUV light source 100A is exchanged or members in the EUV light source 100A are exchanged.

Figure 8:
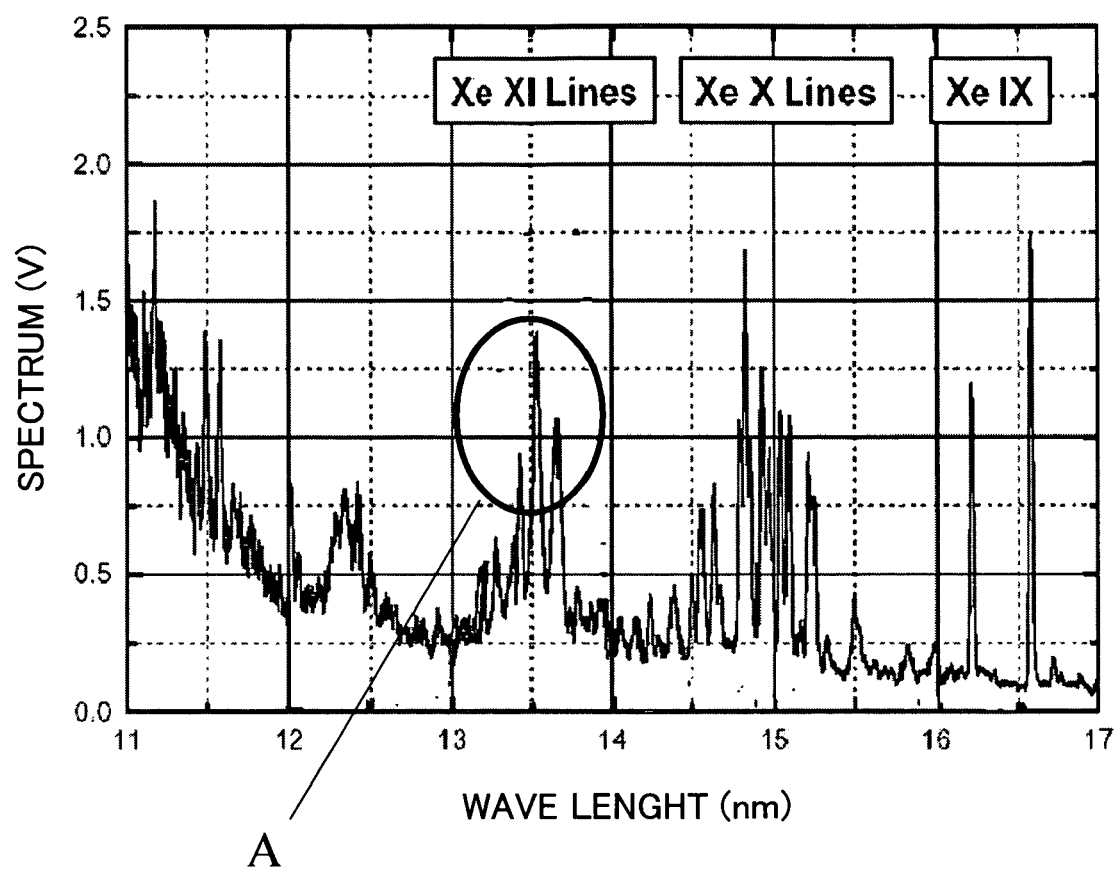
FIG. 8 is a view of one example of a detected result detected by the spectrum detector shown in FIGS. 6 and 7.

For example, when the EUV light source 100A is exchanged, the spectrum of the EUV light in the initial state is detected using the spectrum detector 200C. FIG. 8 shows the spectrum of the EUV light detected by the spectrum detector 200C.

Next, the EUV light source 100A is repeatedly used (for a long time), the spectrum of the EUV light is periodically detected to a timing expect exposing the object 700 or an arbitrary timing using the spectrum detector 200C. Although the evaluation part 300 compares the spectrum obtained by this detecting with the spectrum of the initial state, it is not necessary to compare all spectra, and compares, for example, the spectra with a wavelength of approximately 13.5 nm shown in A of FIG. 8.

For example, spectra of three wavelengths in the initial state is set to E1, E2, and E3, and spectra of three wavelengths after using the EUV light source 100A over a long-term time is set to E1', E2', and E3'. The evaluation part 300 evaluates the exhausted life of the EUV light source 100A, if $0.95 < E1'/E1 < 1.05$, $0.95 < E2'/E1 < 1.05$ and $0.95 < E3'/E3 < 1.05$, and a spectrum coefficient are not contained to ±5%.

The spectrum detector 200C is provided between the condensing point IF of the EUV light and the optical integrator 420, the spectrum of the EUV light from the condensing point IF is detected using the spectrum detector 200C. Thereby, the influence of the noise is reduced, and an information of the spectrum of the EUV light can be obtained with high accuracy. Therefore, the life of the EUV light source 100A can be correctly evaluated based on the detected result by the spectrum detector 200C.

Turning back to FIG. 1, the illumination optical system 400 is an optical system that illuminates the mask 500, and includes, as above-mentioned, the illumination system mirror 410 and the optical integrator 420 etc. The optical integrator 420 uniformly illuminates the mask 500 with a predetermined aperture. The illumination optical system 400 further includes an aperture 430 to limit the illumination area to an arc shape at a position conjugate with the mask 500.

The mask 500 is a reflection mask, and has a circuit pattern (or image) to be transferred. The mask 500 is supported and driven by the mask stage 550. The diffracted light emitted from the mask 500 is projected onto the object 700 after reflected by the projection optical system 600. The mask 500 and the object 700 are arranged optically conjugate with each other. Since the exposure apparatus 1 is a scanner, the mask 500 and object 700 are scanned to transfer a reduced size of a pattern of the mask 500 onto the object 700.

The mask stage 550 supports the mask 500 and is connected to a moving mechanism (not shown). The mask stage 550 may use any structure known in the art. The moving mechanism (not shown) may includes a linear motor etc., and drives the mask stage 550 at least in a direction X and moves the mask 500. The exposure apparatus 1 synchronously scans the mask 500 and the object 700. The exposure apparatus 1 assigns the direction X to scan the mask 500 or the object 700, a direction Y perpendicular to the direction X, and a direction Z perpendicular to the mask 500 or the object 700.

The projection optical system 600 uses plural mirrors (in other words, plural multilayer mirrors) 610 to project a reduce size of a pattern of the mask 500 onto the object 700. The number of mirrors 610 is about four to six. For wide exposure area with the small number of mirrors, the mask 500 and object 700 are simultaneously scanned to transfer a wide area that is an arc-shape area or ring field apart from the optical axis by a predetermined distance. The projection optical system 600 has a NA of about 0.2 to 0.3.

The instant embodiment uses a wafer as the object 700 to be exposed, but it may include a spherical semiconductor and liquid crystal plate and a wide range of other objects to be exposed. Photoresist is applied onto the object 700.

The object 700 to be exposed is held by the wafer stage 750 by a wafer chuck. The wafer stage 750 moves the object 700, for example, using a linear motor in XYZ directions. The mask 500 and the object 700 are synchronously scanned. The positions of the mask stage 550 and wafer stage 750 are monitored, for example, by a laser interferometer, and driven at a constant speed ratio.

The alignment detecting mechanism 800 measures a positional relationship between the position of the mask 500 and the optical axis of the projection optical system 600, and a positional relationship between the position of the object 700 and the optical axis of the projection optical system 600, and sets positions and angles of the mask stage 550 and the wafer stage 750 so that a projected image of the mask 300 may accord with the object 700.

The focus position detecting mechanism 900 measures a focus position on the object 700 surface, and controls over a position and angle of the wafer stage 750 always maintains the object 700 surface at an imaging position of the projection optical system 600 during exposure.

In exposure, the EUV light emitted from the EUV light source 100 illuminates the mask 500, and images a pattern of the mask 500 onto the object 700 surface. The instant embodiment uses an arc or ring shaped image plane, scans the mask 500 and object 700 at a speed ratio corresponding to a reduction rate to expose the entire surface of the mask 500. The exposure apparatus 1 detects the EUV light using the detector 200 arranged at the clean environment (high vacuum atmosphere) without receiving the influences of the noises and electromagnetic wave, and correctly evaluates the life of the EUV light source 100 based on the detected result. Thereby, the exposure apparatus 1 can prevent exposing using the EUV light source 100 that must be exchanged and exchanging the EUV light source 100 that does not need to be exchanged. Therefore, the EUV light source 100 used for the exposure apparatus 1 can stably provide the EUV light to uniformly illuminate the mask 500. Thus, the exposure apparatus 1 achieves an excellent exposure performance, and provides devices (such as semiconductor devices, LCD devices, image pickup devices (e.g., CCDs), and thin film magnetic heads) with a high throughput and good economical efficiency.

Figure 9:
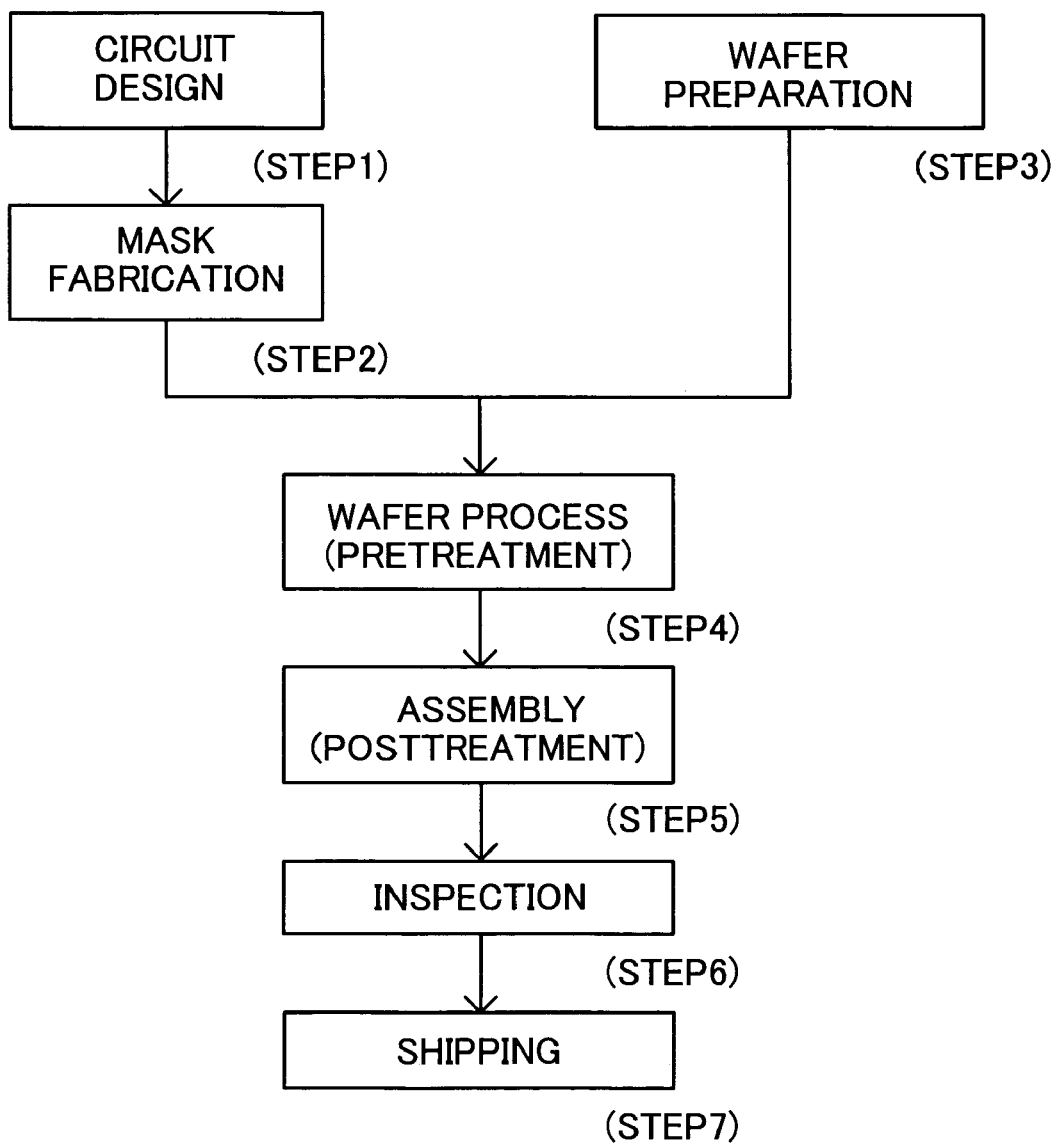
FIG. 9 is a flowchart for explaining how to fabricate devices (such as semiconductor chips such as ICs, LCDs, CCDs, and the like)
Figure 10:
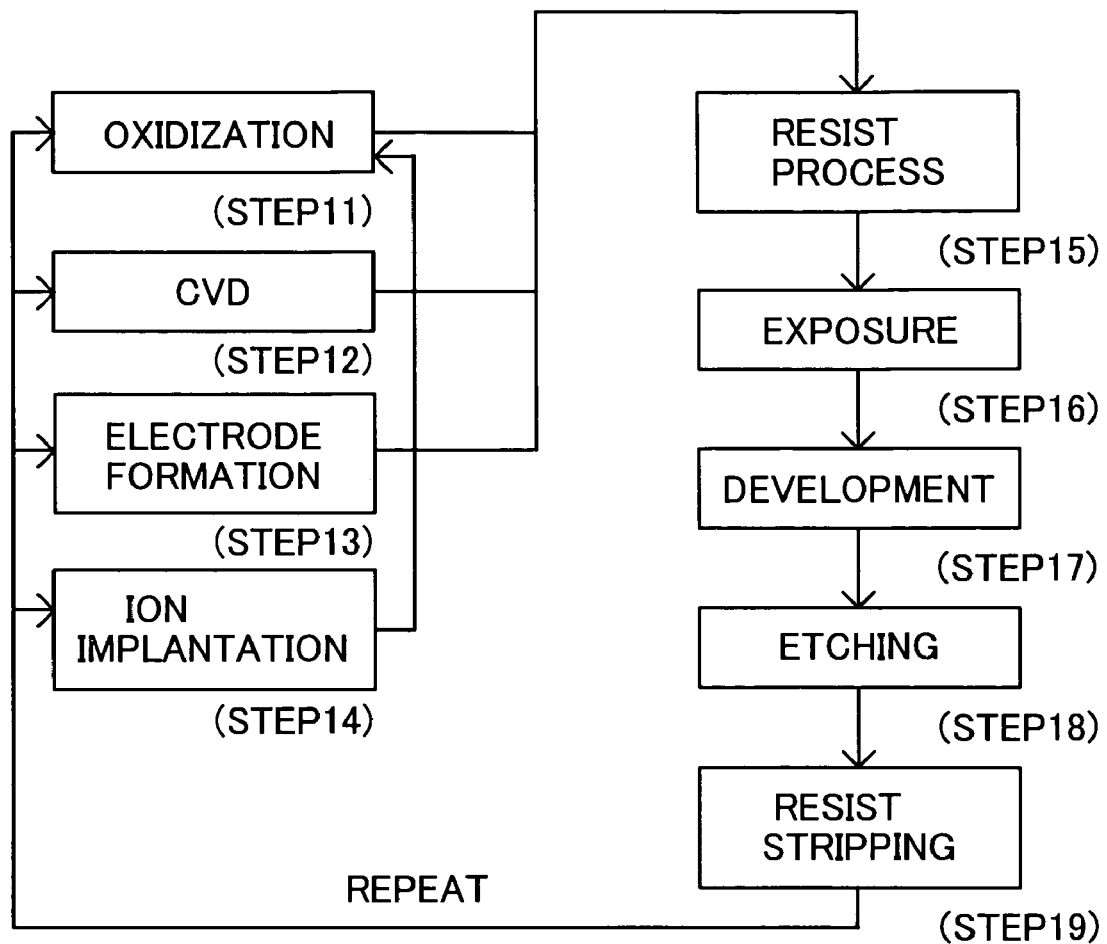
FIG. 10 is a detail flowchart of a wafer process in Step 4 of FIG. 9.

Referring now to FIGS. 9 and 10, a description will be given of an embodiment of a device fabrication method using the above mentioned exposure apparatus 1. FIG. 9 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 10 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a circuit pattern from the mask onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one. Thus, the device fabrication method using the exposure apparatus 1, and resultant devices constitute one aspect of the present invention.

Furthermore, the present invention is not limited to these preferred embodiments and various variations and modifications may be made without departing from the scope of the present invention.

This application claims a foreign priority benefit based on Japanese Patent Applications No. 2004-320080, filed on Sep. 4, 2004, which is hereby incorporated by reference herein in its entirety as if fully set forth herein.

What is claimed is:

1. An exposure apparatus for exposing a pattern of a mask onto an object, said exposure apparatus comprising:
    a light source part that includes a generating mechanism for generating a plasma, a condenser mirror for condensing a light radiated from the plasma, and a vacuum chamber for accommodating the generating mechanism and the condenser mirror, and has an opening that is provided at a position approximately corresponding to a position of a condensing point of the light condensed by the condenser mirror;
    an illumination optical system comprising an optical integrator for illuminating the mask using the light from the light source part;
    a detector provided at an incident side of the optical integrator configured to detect the light from the condensing point at an emission side of the condensing point; and
    an evaluation part for evaluating a life of the light source part based on a detected result by the detector.

2. An exposure apparatus according to claim 1, further comprising a multilayer mirror that is provided at an incident side of the detector, and reflects the light.

3. An exposure apparatus according to claim 2, wherein said multilayer film mirror is provided at the emission side of the condensing point.

4. An exposure apparatus according to claim 1, wherein said condenser mirror has a multilayer film for reflecting the light.

5. An exposure apparatus according to claim 1, further comprising an aperture that is provided near the condensing point.

6. An exposure apparatus according to claim 1, wherein said detector detects a light intensity of the light.

7. An exposure apparatus according to claim 1, wherein said detector detects a spectrum with a predetermined wavelength region of the light.

8. An exposure apparatus according to claim 1, wherein said detector detects an angle distribution of the light.

9. An exposure apparatus according to claim 1, wherein said detector detects a spatial distribution of the light.

10. An exposure apparatus according to claim 1, wherein said light has a wavelength of 20 nm or less.

11. A device fabrication method comprising the steps of:
 exposing an object using an exposure apparatus according to claim 1; and
 performing a development process for the object exposed.

12. An evaluation method for evaluating a life of a light source part used in an exposure apparatus for exposing a pattern of a mask onto an object, the exposure apparatus includes a light source that includes a generating mechanism for generating a plasma, a condenser mirror for condensing a light radiated from the plasma, and a vacuum chamber for accommodating the generating mechanism and the condenser mirror, and has an opening that is provided at a position approximately corresponding to a position of a condensing point of the light condensed by the condenser mirror, and an illumination optical system comprising an optical integrator for illuminating the mask using the light from the light source part, said evaluation method comprising the steps of:
 storing a condition of the light from the condensing point in an initial state;
 detecting the light from the condensing point at a position located on an emission side of the condensing point and an incident side of the optical integrator;
 comparing the detected result detected by the detecting step and the condition of the light stored by the storing step; and
 evaluating an exhausted life of the light source part when a difference between the detected result detected by the detecting step and the condition of the light stored by the storing step exceeds a threshold set beforehand in the comparing step.

* * * * *